(12) United States Patent
Koyama et al.

(10) Patent No.: US 7,511,709 B2
(45) Date of Patent: Mar. 31, 2009

(54) DISPLAY DEVICE

(75) Inventors: Jun Koyama, Sagamihara (JP); Keitaro Imai, Yokohama (JP); Shinji Maekawa, Atsugi (JP); Makoto Furuno, Atsugi (JP); Osamu Nakamura, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 557 days.

(21) Appl. No.: 10/884,945

(22) Filed: Jul. 7, 2004

(65) Prior Publication Data

US 2005/0012887 A1    Jan. 20, 2005

(30) Foreign Application Priority Data

Jul. 18, 2003    (JP)    ............... 2003-277119

(51) Int. Cl.
 *G09G 5/00*    (2006.01)
(52) U.S. Cl. ...................... 345/206; 345/100
(58) Field of Classification Search ........... 345/76–100, 345/206; 349/149–152; 313/498–500; 315/169.3
See application file for complete search history.

(56) References Cited

U.S. PATENT DOCUMENTS

| | | | |
|---|---|---|---|
| 5,091,334 A | 2/1992 | Yamazaki et al. | |
| 5,262,350 A | 11/1993 | Yamazaki et al. | |
| 5,262,654 A | 11/1993 | Yamazaki | |
| 5,289,030 A | 2/1994 | Yamazaki et al. | |
| 5,453,858 A * | 9/1995 | Yamazaki | 349/43 |
| 5,591,987 A | 1/1997 | Yamazaki et al. | |
| 5,764,225 A * | 6/1998 | Koshobu | 345/211 |
| 5,849,601 A | 12/1998 | Yamazaki | |
| 5,859,443 A | 1/1999 | Yamazaki et al. | |
| 5,889,291 A | 3/1999 | Koyama et al. | |
| 5,949,397 A | 9/1999 | Koyama et al. | |
| 6,252,249 B1 | 6/2001 | Yamazaki | |
| 6,288,487 B1 | 9/2001 | Arai | |

(Continued)

FOREIGN PATENT DOCUMENTS

CN    1394293    1/2003

(Continued)

OTHER PUBLICATIONS

Office Action (Application No. 200410071231.8) dated Aug. 24, 2007.

(Continued)

*Primary Examiner*—Bipin Shalwala
*Assistant Examiner*—Kenneth B Lee, Jr.
(74) *Attorney, Agent, or Firm*—Eric J. Robinson; Robinson Intellectual Property Law Office, P.C.

(57) ABSTRACT

When semi-amorphous TFTs are used for forming a signal line driver circuit and a pixel, a large amplitude is required for driving the pixel, and a large power supply voltage is thus needed. On the other hand, when a shift register is made up of transistors having a single conductivity, a bootstrap circuit is required, and a voltage over a power supply is applied to a specific element. Therefore, not both the driving amplitude and the reliability can be achieved with a single power supply. According to the invention, a level shifter having a single conductivity is provided to solve such a problem.

20 Claims, 15 Drawing Sheets

U.S. PATENT DOCUMENTS

| | | |
|---|---|---|
| 6,295,047 B1 | 9/2001 | Koyama et al. |
| 6,355,941 B1 | 3/2002 | Yamazaki et al. |
| 6,407,431 B2 * | 6/2002 | Yamazaki et al. ........... 257/353 |
| 6,417,830 B1 | 7/2002 | Byeon, II |
| 6,476,791 B2 | 11/2002 | Koyama et al. |
| 6,480,181 B2 | 11/2002 | Ishii |
| 6,580,423 B1 | 6/2003 | Murade |
| 6,747,627 B1 | 6/2004 | Koyama et al. |
| 6,774,419 B2 | 8/2004 | Kimura |
| 6,897,841 B2 | 5/2005 | Ino |
| 6,989,813 B2 * | 1/2006 | Komiya et al. .............. 345/100 |
| 2002/0033783 A1 * | 3/2002 | Koyama ....................... 345/82 |
| 2002/0070382 A1 | 6/2002 | Yamazaki et al. |
| 2003/0210219 A1 * | 11/2003 | Osame ........................ 345/92 |

FOREIGN PATENT DOCUMENTS

| | | |
|---|---|---|
| EP | 1 243 965 | 9/2002 |

OTHER PUBLICATIONS

Specification, Claims, Abstract of U.S. Appl. No. 10/885,074, filed Jul. 7, 2004.

* cited by examiner

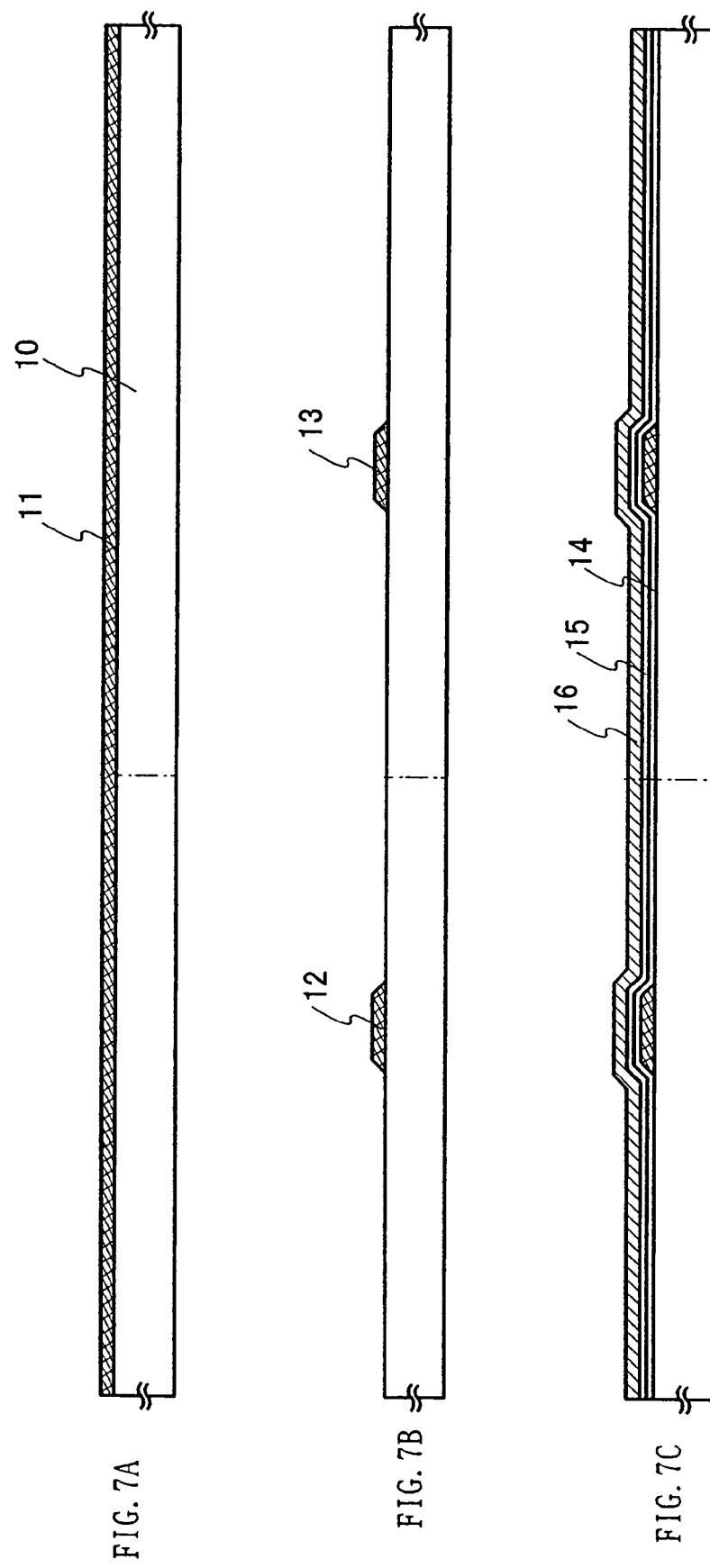

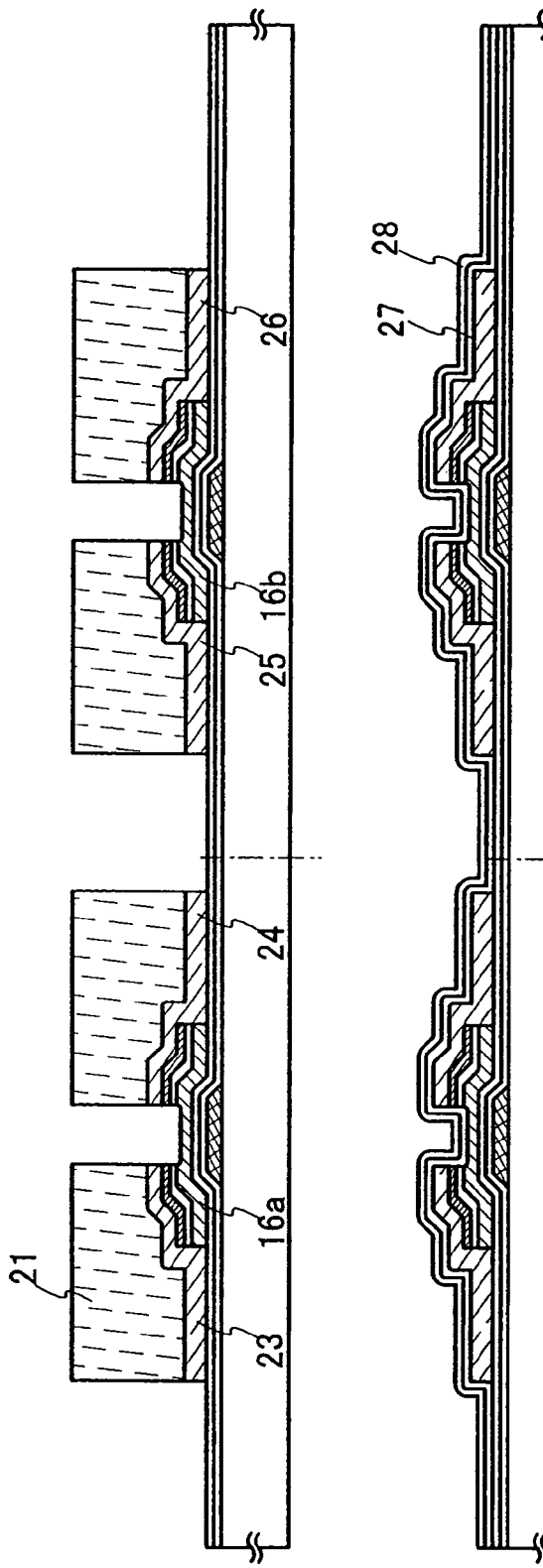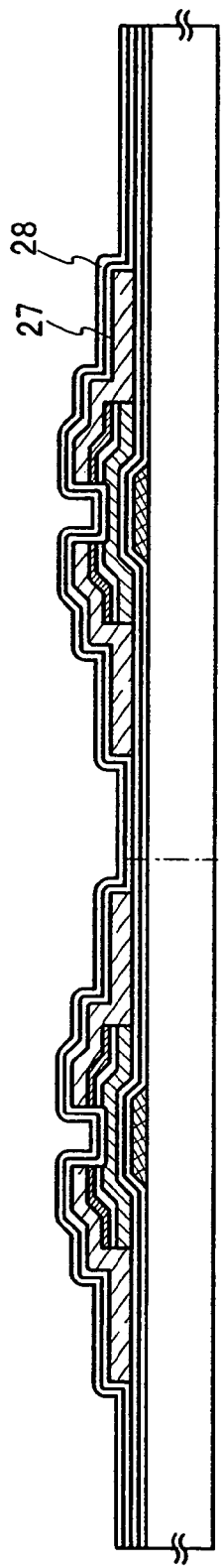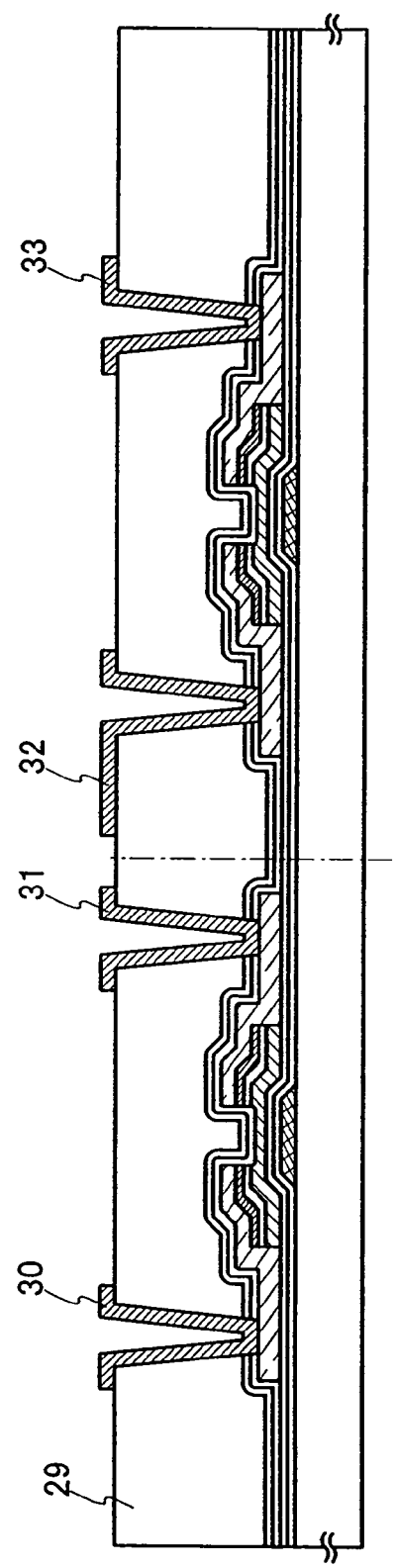

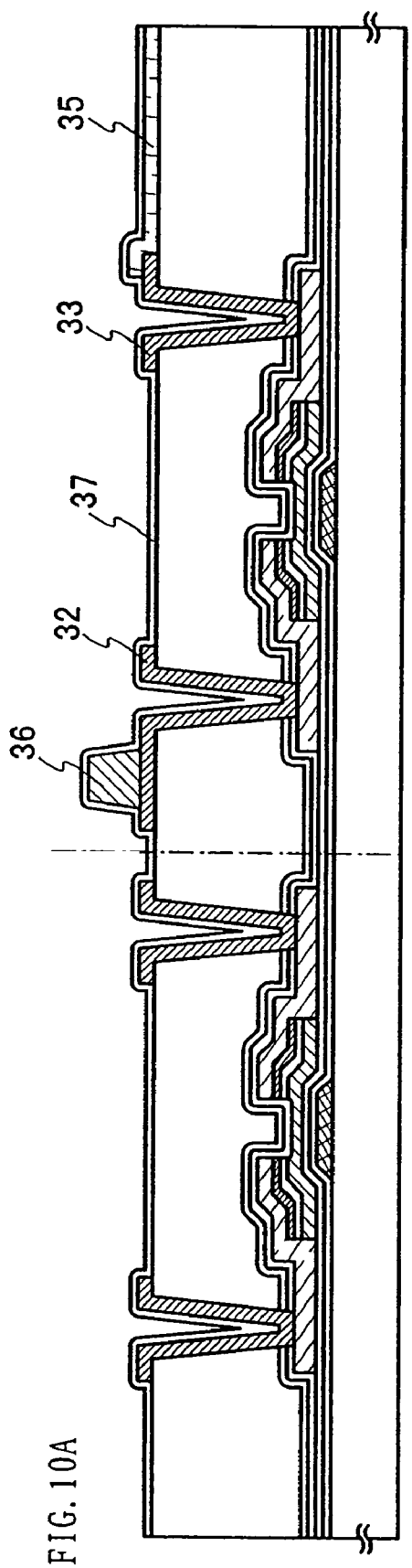
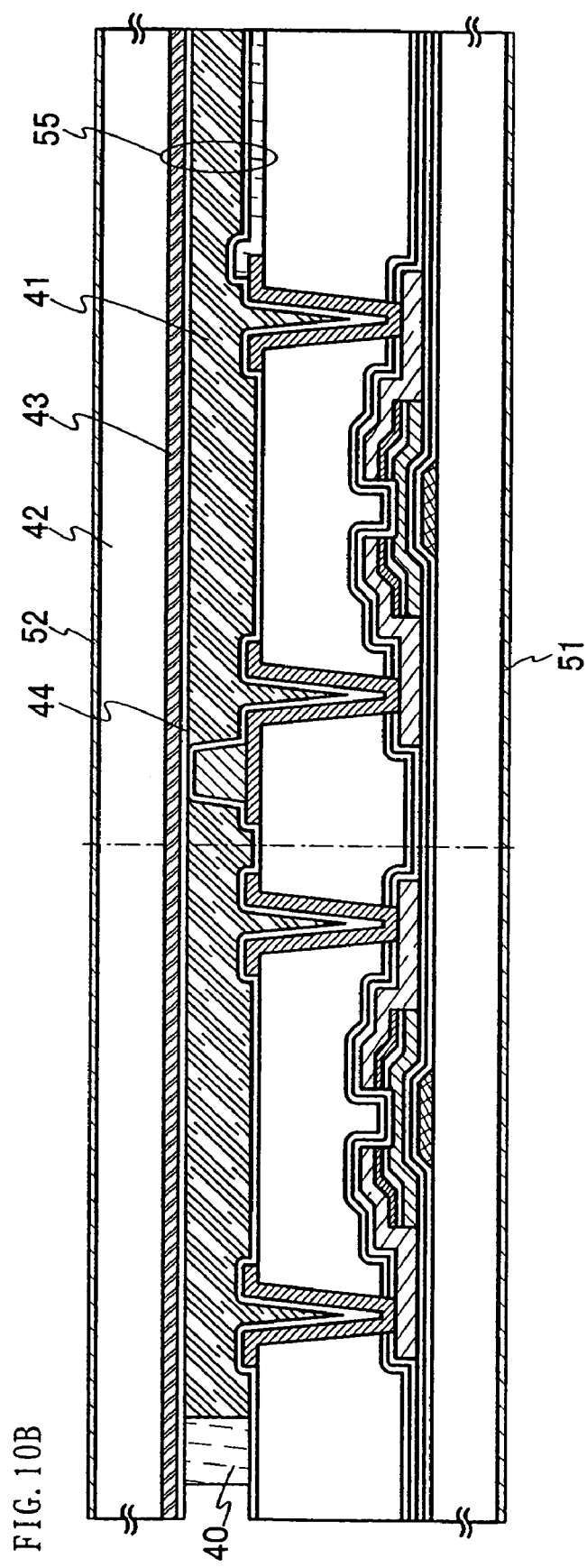
FIG. 10A
FIG. 10B

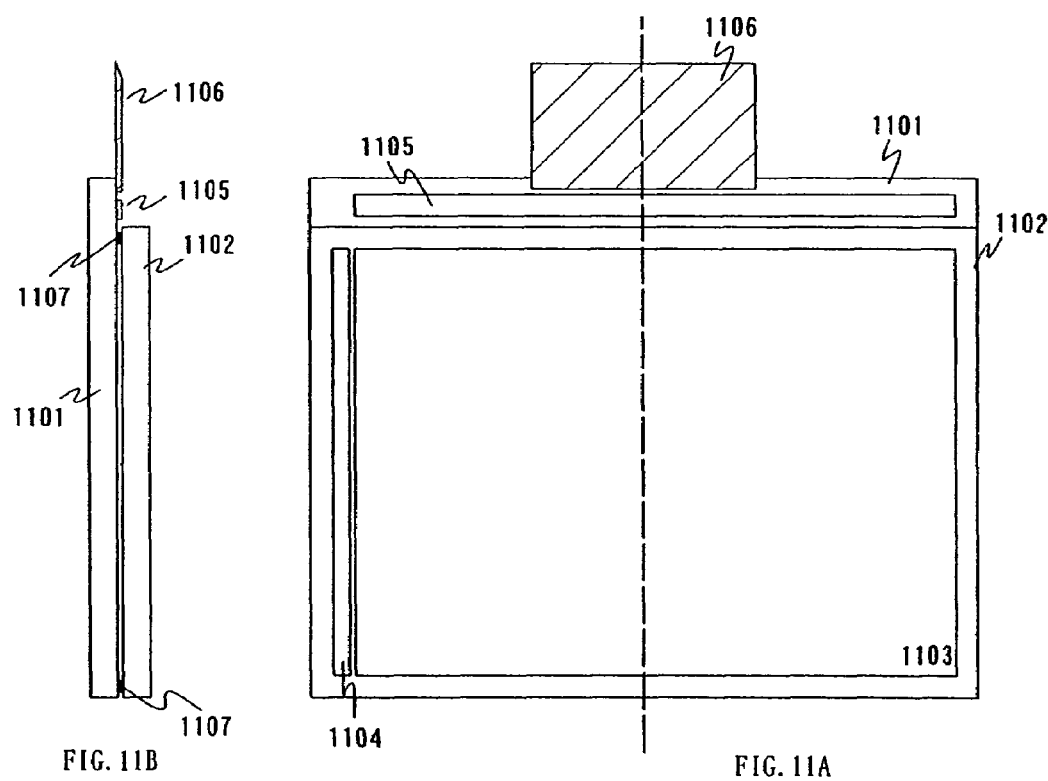

DISPLAY DEVICE

BACKGROUND OF THE INVENTION

1. Field of the Invention

The present invention relates to a display device, and more particularly, to a display device comprising an element using a semi-amorphous thin film semiconductor. The invention further relates to an electronic apparatus using the display device.

2. Description of the Related Art

In recent years, Internet has been widely used with the development of communication technologies. It is expected that moving pictures and larger amount of information are transmitted in the future. In view of this, personal computers have been popularized for private use and on business, and a large sized display device such as a liquid crystal television has also been produced in quantities and popularized.

Among the display devices, a display device using a thin film transistor (hereinafter referred to as a TFT), such as a liquid crystal display device in particular, has been manufactured actively. An active matrix display device using a TFT can exhibit a higher image quality in contrast and gray scale levels as compared with a passive display device.

In such a display device using a TFT, a TFT whose channel forming region is formed of an amorphous semiconductor (hereinafter referred to as an amorphous TFT) is widely used. A display device using an amorphous TFT displays images by using an inverted staggered TFT formed on a glass substrate and controlling pixels of the display device each including the TFT.

FIG. 4A is a plan view of a liquid crystal display device using an amorphous TFT. In FIG. 4A, a conventional liquid crystal display device comprises an amorphous TFT substrate 401, a counter substrate 402, a pixel portion 403, source signal line driver LSIs 405, gate signal line driver LSIs 404, FPCs 406, and the like. The signal line driver LSIs 404 and 405 are formed of single crystalline LSIs and mounted on the amorphous TFT substrate 401. Signals are inputted from outside to the signal line driver LSIs 404 and 405 via the FPCs 406. Although the LSIs are mounted on the amorphous TFT substrate 401 in FIG. 4A, they may be mounted on the FPCs.

FIG. 4B shows a cross sectional structure taken by cutting along a dotted line of FIG. 4A. A liquid crystal is disposed between the amorphous TFT substrate 401 and the counter substrate 402 and sealed with a sealing member 407.

SUMMARY OF THE INVENTION

The aforementioned liquid crystal display device using an amorphous TFT has a problem that the property of a transistor, for example a mobility or a threshold value, is inferior to that of a transistor using single crystalline silicon.

For example, when comparing the mobility of an N-channel single crystalline transistor with an amorphous TFT, the former has a mobility of 600 to 800 cm²/Vs, whereas the latter has a mobility of about 0.5 cm²/Vs. Thus, the electrical property of the amorphous TFT is 1/1000 that of the single crystalline transistor, and therefore, it cannot make up an electrical circuit as free as the single crystalline transistor. The amorphous TFT is capable of driving pixels but not signal lines in a liquid crystal display device.

Accordingly, in a liquid crystal display device using an amorphous TFT, a driver circuit for driving signal lines is made up of LSIs using single crystalline transistors. The LSIs can drive the signal lines, however, the driver circuit has to be attached externally or connected to a glass substrate, leading to defects such as increase in the cost of implementation, and lowered reliability in a connecting part. On the other hand, a display device in which pixels and a driver circuit are integrally formed on a glass substrate by using a polysilicon TFT has been developed. A polysilicon TFT exhibits a mobility of about 100 to 200 cm²/Vs, thus a driver circuit can be formed integrally. In order to form a polysilicon TFT, however, manufacturing steps for laser crystallization, heat treatment, doping and the like are additionally required. Therefore, a glass substrate can not be made larger due to limitations of the manufacturing equipment and the costs are increased as compared with an amorphous TFT.

In view of the foregoing, pixels, a signal line driver circuit, and a gate signal line driver circuit in particular may be integrally formed by using a semi-amorphous semiconductor (hereinafter referred to as an SAS) so that external driver circuits and connecting parts thereof are reduced and the cost of implementation and reliability in the connecting parts are improved. However, a threshold voltage of an SAS TFT is higher than that of a polysilicon TFT, therefore, the amplitude for driving a signal line has to be made larger and a power supply voltage has to be made higher in the case of forming a pixel by using the SAS.

FIG. 2 shows a buffer circuit of a conventional signal line driver circuit, which buffers a signal of a shift register and drives a gate signal line. The buffer circuit shown in FIG. 2 is made up of three stages of circuits 226, 227 and 228. The first stage circuit 226 comprises an inverter (including TFTs 206 and 207) for inverting a signal inputted from an input terminal 201, a bootstrap circuit which includes TFTs 208, 210 and 211, and a capacitor 209, and TFTs 212 and 213 for driving the second stage circuit 227. The second stage circuit 227 comprises a bootstrap circuit which includes TFTs 214, 216 and 217, and a capacitor 215, and TFTs 218 and 219 for driving the third stage circuit 228. The third stage circuit 228 comprises a bootstrap circuit which includes TFTs 220, 222 and 223, and a capacitor 221, and TFTs 224 and 225 for driving an output terminal 202. These three stages of the buffer circuit are all connected to a power supply potential 203.

FIG. 3 shows a specific configuration of a shift register using a transistor having a single conductivity, taking an N-channel transistor as an example herein. In the case of using a P-channel transistor, the operations are basically the same though signals are inverted. FIG. 3 shows one stage of a shift register. In FIG. 3, TFTs 301 to 304 are operated by signals UD and UDb for switching the operating direction, and signals LIN1, LIN2, RIN1, and RIN2 select a signal to be inputted to the main body of the shift register.

The main body of the shift register includes TFTs 305 to 307, 310, and 311 and outputs a shifted signal to an output terminal OUT. A RESET signal is inputted to a TFT 309 for initial setting. When the output terminal OUT of the shift register is High, charges held in a capacitor 314 are not discharged and continue to be held as there is no discharge path. That is, the output terminal OUT reaches High, namely a power supply potential, while not varying a gate-source voltage of the TFT 310. Therefore, a gate potential of the TFT 310 becomes higher than a high potential power supply 313. Accordingly, a higher voltage than the high potential power supply 313 is applied to the TFT 306 which is connected to the gate of the TFT 310, resulting in lower reliability.

In particular, the high potential power supply 313 originally needs a high voltage as described above. Thus, there arises a problem when a higher voltage than the high potential power supply 313 is applied to the TFT 306.

In view of the foregoing, the invention provides a level shifter which is suitable for a transistor having a single conductivity. By using the level shifter for a buffer circuit, a power supply potential of a shift register can be lowered while maintaining a power supply potential needed for driving a pixel. As a result, even when a voltage over the power supply potential of the shift register is generated by bootstrapping, reliability can be prevented from being lowered.

A display device of the invention comprises a substrate which includes a plurality of scan lines, a plurality of pixels, and a scan line driver circuit. The pixels and the scan line driver circuit are formed integrally on the substrate and each comprises a TFT whose channel portion is formed of a semi-amorphous semiconductor (s semi-amorphous TFT). The scan line driver circuit comprises a shift register and a level shifter.

A display device of the invention comprises a substrate which includes a plurality of scan lines, a plurality of pixels, and a scan line driver circuit. The pixels and the scan line driver circuit are formed integrally on the substrate and each comprises a TFT whose channel portion is formed of a semi-amorphous semiconductor. The scan line driver circuit comprises a shift register, a level shifter, a first power supply terminal, and a second power supply terminal. The shift register is connected to the first power supply terminal and an output of the level shifter is connected to the second power supply terminal.

A display device of the invention comprises a substrate which includes a plurality of scan lines, a plurality of pixels, and a scan line driver circuit. The pixels and the scan line driver circuit are formed integrally on the substrate and each comprises a TFT whose channel portion is formed of a semi-amorphous semiconductor. The scan line driver circuit comprises a level shifter, a first power supply terminal, and a second power supply terminal. The level shifter comprises a first TFT whose gate is connected to the first power supply terminal and whose source is inputted a signal, a second TFT whose gate is connected to a drain of the first TFT and whose drain is connected to the second power supply terminal, and a capacitor one end of which is connected to the gate of the second TFT and the other end of which is connected to a source of the second TFT.

In the aforementioned display device according to the invention, a voltage of the first power supply terminal is set lower than that of the second power supply terminal.

In the aforementioned display device according to the invention, the TFT is an N-channel transistor.

According to the invention, the aforementioned display device is a liquid crystal display device.

According to the invention, the aforementioned display device is a self-light emitting display device.

According to the invention, the aforementioned display device is formed by using an EL material.

The invention provides an electronic apparatus using the aforementioned display device.

As set forth above, the invention adopts a level shifter which is suitable for a transistor having a single conductivity, thereby lowering a power supply potential of a shift register while not lowering a power supply potential for driving a pixel. Accordingly, degradation of TFTs can be prevented even when adopting a bootstrap shift register.

In such a manner, the invention provides a display device in which a signal line driver circuit and a gate signal line driver circuit in particular are integrally formed by using a TFT having few limitations in manufacturing steps, namely a TFT whose channel portion is formed of a semi-amorphous semiconductor.

BRIEF DESCRIPTION OF THE DRAWINGS

FIGS. 7A to 7C are cross sectional views showing manufacturing steps of the invention.

FIGS. 9A to 9C are cross sectional views showing manufacturing steps of the invention.

FIGS. 10A and 10B are cross sectional views showing manufacturing steps of the invention.

FIGS. 11A and 11B are diagrams each showing a liquid crystal display device according to the invention.

DETAILED DESCRIPTION OF THE INVENTION

Embodiment Mode

Figure 1:
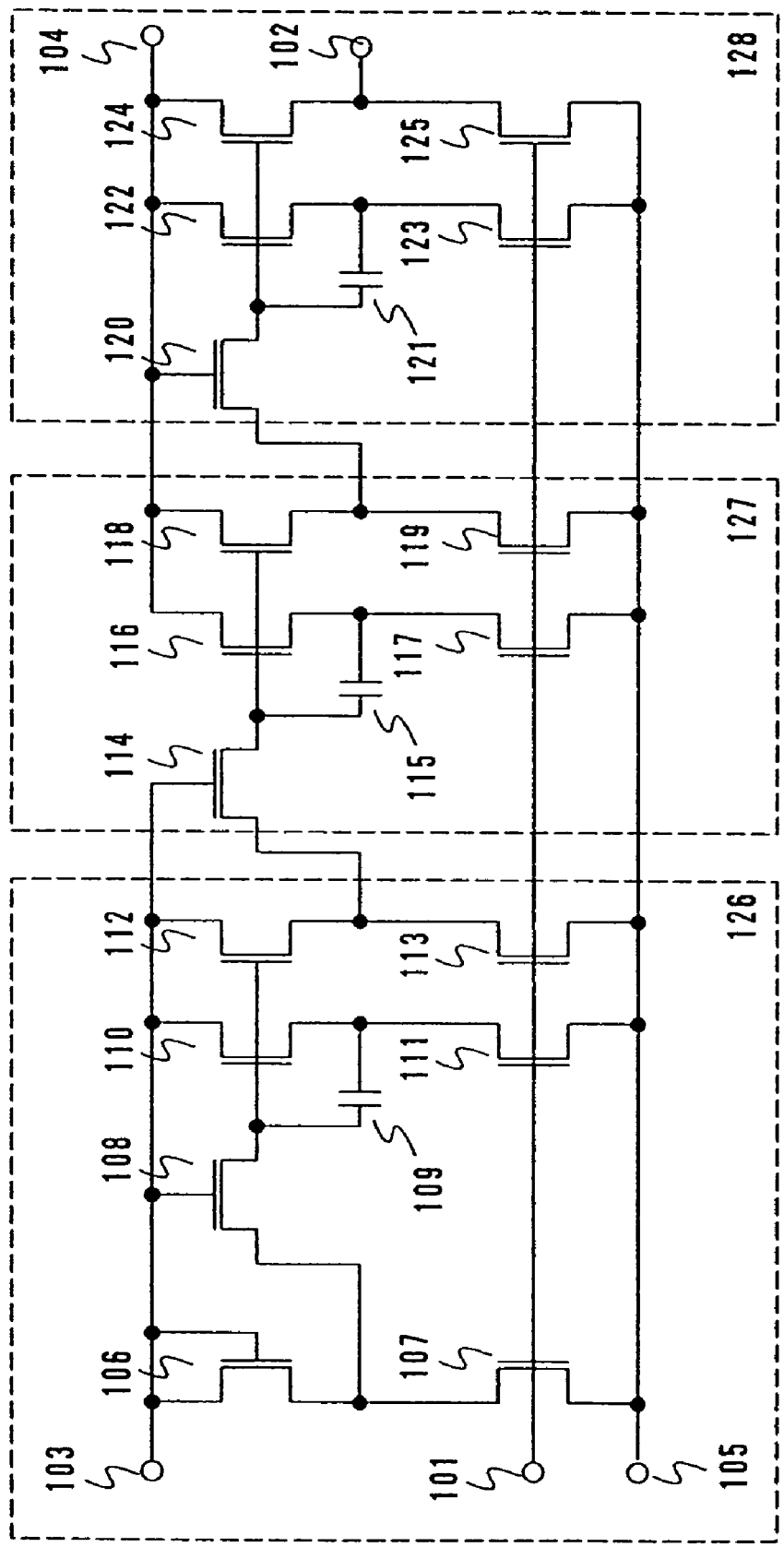
FIG. 1 is a diagram showing an embodiment mode of the invention.
Figure 2:
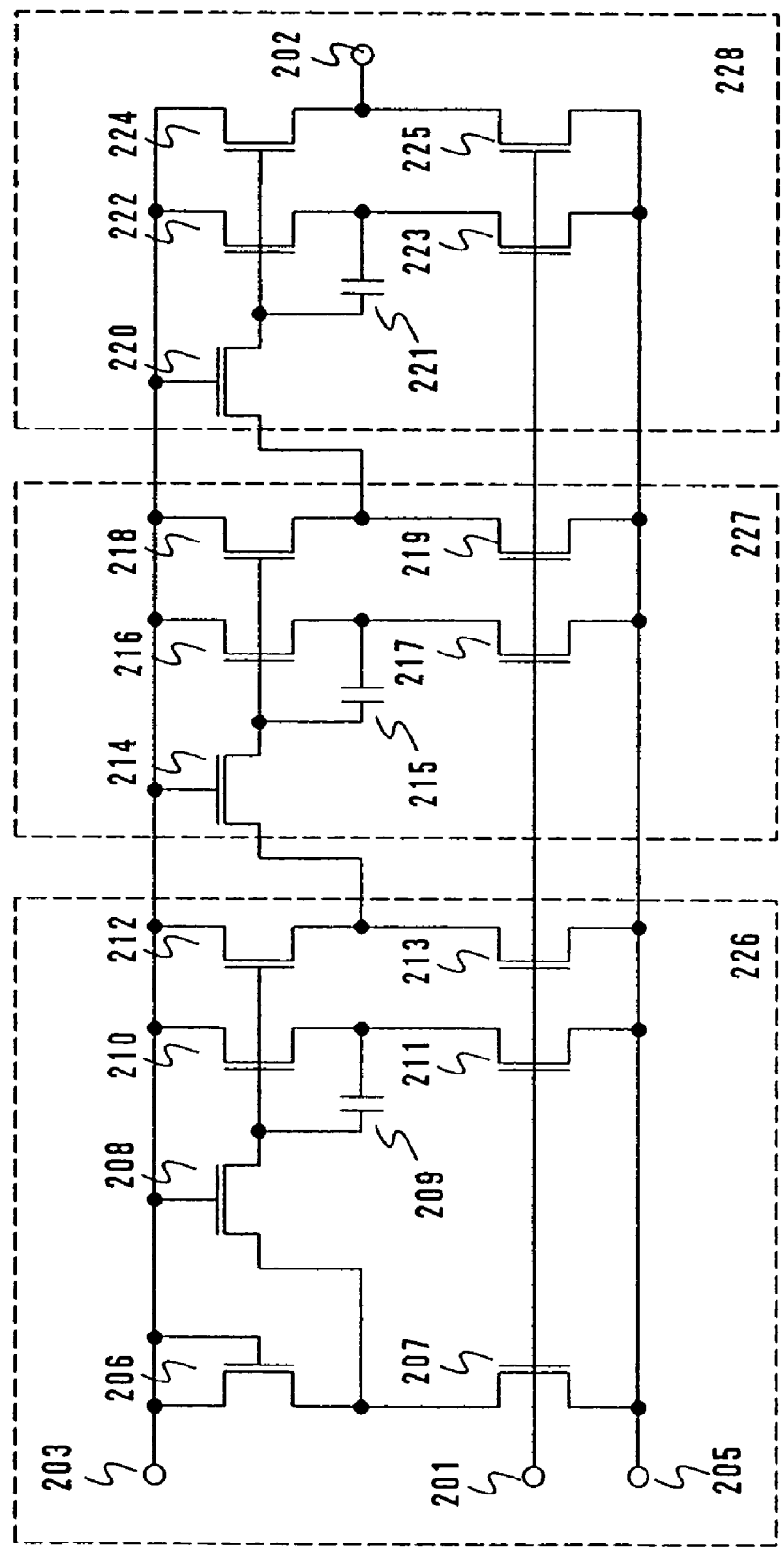
FIG. 2 is a diagram showing a conventional buffer circuit having a single conductivity.
Figure 3:
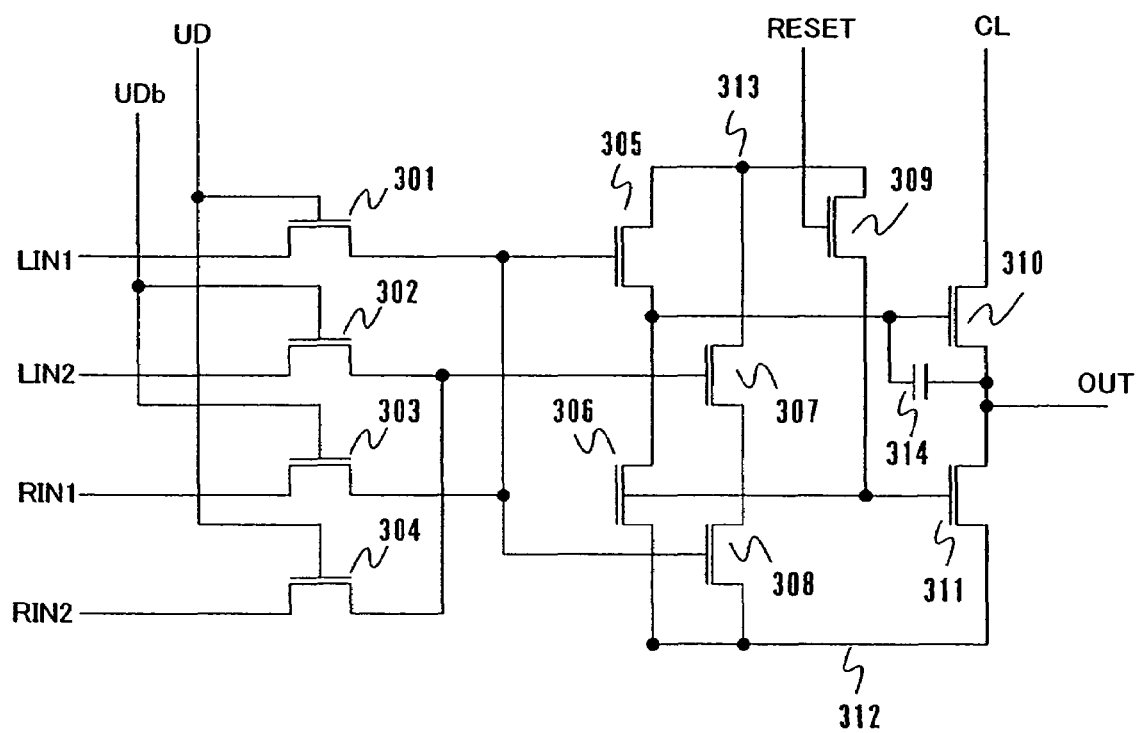
FIG. 3 is a diagram showing a conventional shift register having a single conductivity.
Figure 4:
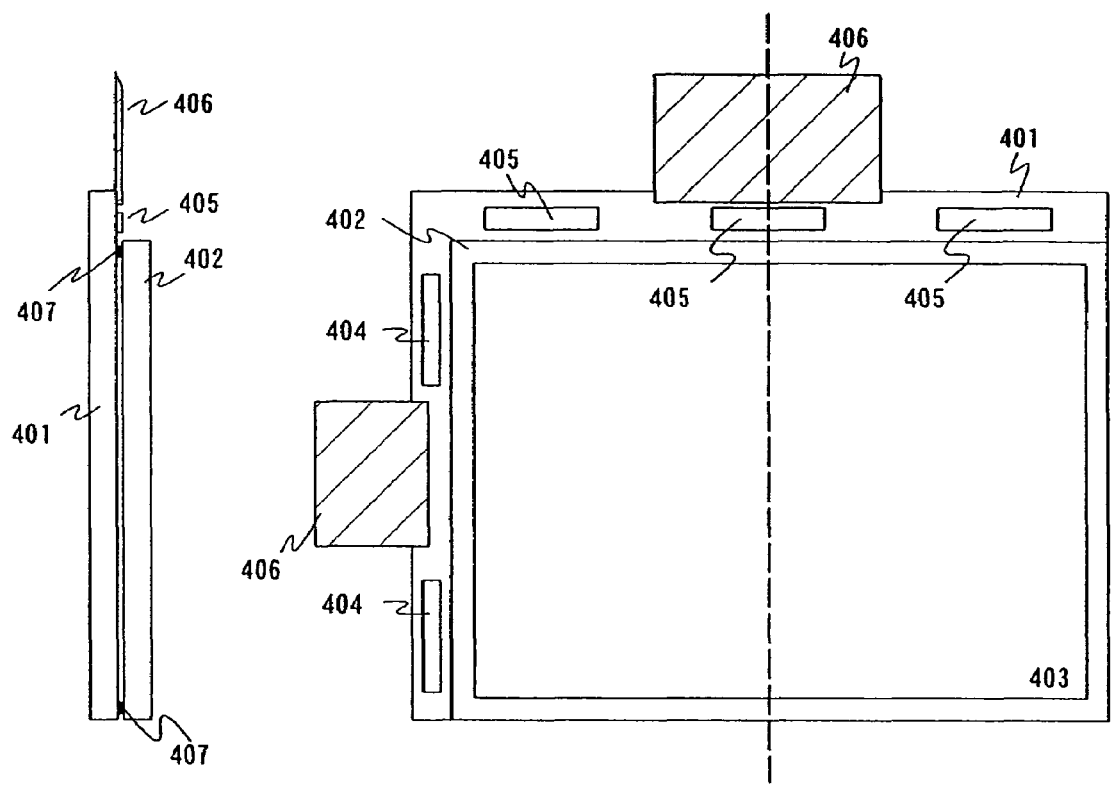
FIGS. 4A and 4B are diagrams each showing a conventional amorphous liquid crystal display device.

FIG. 1 shows an embodiment mode of the invention. A circuit shown in FIG. 1 is made up of three stages as the conventional buffer circuit shown in FIG. 2, though a first stage circuit 126 and a third stage circuit 128 function as buffer circuits and a second stage circuit 127 functions as a level shifter.

The first stage circuit 126 has the same configuration as that of the conventional buffer circuit. That is, the first stage circuit 126 comprises an inverter circuit (including TFTs 106 and 107) for inverting a signal inputted from an input terminal 101, a bootstrap circuit which includes TFTs 108, 110 and 111, and a capacitor 109, and TFTs 112 and 113 for driving the second stage circuit 127 which is a level shifter. The first stage circuit 126, however, is driven by a power supply potential 103 which is lower than a power supply potential 104 for driving pixels, unlike the manner in the conventional buffer circuit. The power supply potential 103 is set equal to that of a shift register so that degradation of elements can be prevented even when adopting a bootstrap configuration.

As in the conventional buffer circuit, the second stage circuit 127 comprises a bootstrap circuit which includes TFTs 114, 116 and 117, and a capacitor 115, and TFTs 118 and 119 for driving the third stage circuit 128. However, the second stage circuit 127 is different from that of the conventional buffer circuit in that a power supply potential of the TFT 114 is set equal to that of the first stage circuit 126 and power supply potentials of the TFTs 116 and 118 are connected to the power supply potential 104 for driving pixels. According to such a connection, the amplitude of the first stage circuit can be level shifted to the same amplitude as the power supply potential for driving pixels.

The third stage circuit 128 has the same configuration as that of the conventional buffer circuit. That is, a bootstrap circuit is made up of TFTs 120, 122 and 123, and a capacitor 121, and TFTs 124 and 125 drive an output terminal 102.

By adopting the level shifter shown in this embodiment mode, the shift register can be driven at a power supply potential which does not affect the reliability, and pixels can be driven at a higher power supply potential.

The aforementioned circuits are made up of TFTs whose channel portions are formed of a semi-amorphous semiconductor. Typically, an inverted staggered TFT (bottom gate TFT) is used, though a staggered TFT (top gate TFT) may be used as well. An N-channel semi-amorphous TFT is more suitably applied to a driver circuit as compared with a P-channel semi-amorphous TFT because of the high mobility. However, either an N-channel TFT or a P-channel TFT may be used in the invention. In either case, it is preferable that all the TFTs formed on the same substrate have the same conductivity in order to reduce the number of manufacturing steps.

Embodiment 1

Figure 5:
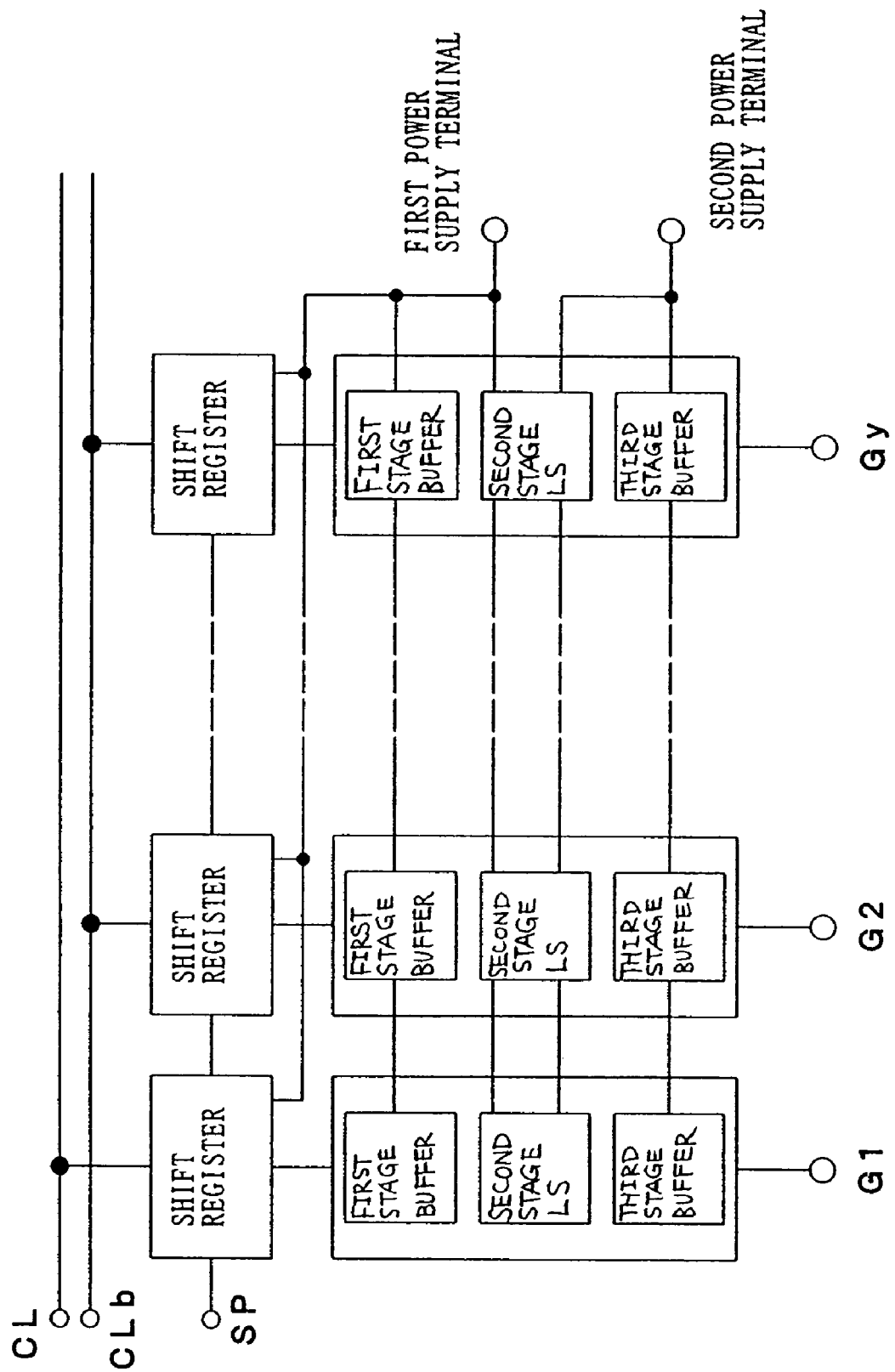
FIG. 5 is a diagram showing an embodiment of a gate signal line driver circuit of the invention.

FIG. 5 is a block diagram showing a gate signal line driver circuit adopting the level shifter of the invention. As shown in FIG. 5, the gate signal line driver circuit comprises a shift register and a buffer circuit which includes a level shifter. The shift register is connected to a first power supply terminal and circuits for driving a gate signal line are connected to a second power supply terminal. A voltage of the first power supply terminal is set lower than that of the second power supply terminal, which prevents the reliability of the shift register from being lowered.

Figure 6:
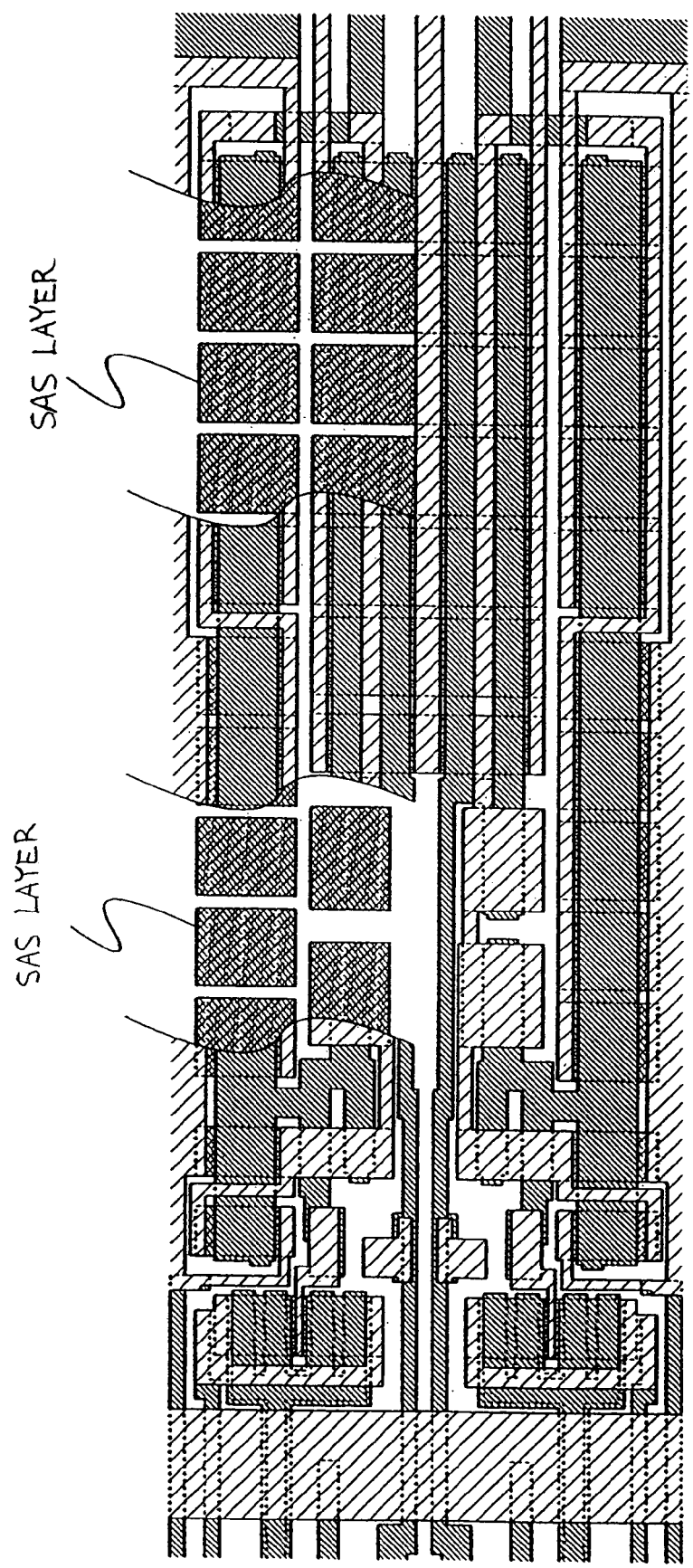
FIG. 6 is a diagram showing an embodiment of the gate signal line driver circuit of the invention.

FIG. 6 shows a layout of the level shifter of the invention. A gate signal line is subjected to high loads, particularly in a display device having a large display area. Therefore, in FIG. 6, the last stage circuit for driving the gate signal line comprises a transistor whose gate is 400 μm in width in order to maintain the current capacity.

Embodiment 2

Manufacturing steps of the display device of the invention are specifically explained hereinafter taking a liquid crystal display device as an example.

For a first substrate 10, a plastic material can be used as well as glass and quartz. Alternatively, an insulating layer may be formed on a metal material such as stainless and aluminum in order to obtain the first substrate 10. A first conductive layer 11 for forming a gate electrode and a gate wiring (scan line) is formed on the first substrate 10. For the first conductive layer 11, a metal material such as chrome, molybdenum, titanium, tantalum, tungsten, and aluminum, or an alloy of these materials is used. The first conductive layer 11 can be formed by sputtering or vacuum vapor deposition (FIG. 7A).

The first conductive layer 11 is etched to form gate electrodes 12 and 13. The gate electrodes 12 and 13 preferably have tapered ends so that a first semiconductor layer and a wiring layer are formed thereon. In the case where the first conductive layer 11 is formed of an aluminum-based material, a surface thereof is preferably insulated by anodization and the like after the etching step. Although not shown, a wiring connected to the gate electrodes can be formed at the same time as this step (FIG. 7B).

Subsequently, as shown in FIG. 7C, a first insulating layer 14 and a second insulating layer 15 are formed over the gate electrodes 12 and 13 in order to function as gate insulating layers. In this case, it is preferable that the first insulating layer 14 is formed of a silicon oxide film whereas the second insulating layer 15 is formed of a silicon nitride film. These insulating layers can be formed by glow discharge decomposition or sputtering. In particular, in order to form an insulating layer having a high density and a small gate leakage current at a low deposition temperature, a reactive gas mixed with a noble gas element such as argon may be added into the insulating layers.

A first semiconductor layer 16 is formed over the first insulating layer 14 and the second insulating layer 15. The first semiconductor layer 16 is formed of a film which includes a semiconductor having an intermediate structure between amorphous and crystalline (including single crystalline and polycrystalline) structures. This semiconductor has a third state which is stable in free energy, and it is a kind of a crystalline semiconductor which has a short range order and a lattice distortion. The semiconductor has a grain size of 0.5 to 40 nm and can be dispersed in a non-single crystalline semiconductor. That is, Raman spectrum is shifted to the lower frequency band than 520 cm$^{-1}$. The semiconductor has a grain size of 0.5 to 40 nm on an average and can be dispersed in a non-single crystalline semiconductor. Further, the semiconductor is mixed with at least 1 atom % of hydrogen or halogen as the neutralizing agent for dangling bond. Such a semiconductor is called a semi-amorphous semiconductor (SAS). When a noble gas element such as helium, argon, krypton, or neon is mixed into an SAS, the lattice distortion is increased and the stability is thus enhanced, leading to a good SAS.

The SAS can be obtained by glow discharge decomposition of silicon gas. Typically, SiH$_4$ is used as a silicon gas, though Si$_2$H$_6$, SiH$_2$Cl$_2$, SiHCl$_3$, SiCl$_4$, SiF$_4$ or the like may be used as well. The formation of the SAS can be facilitated by using the silicon gas which is diluted by adding a single or a plurality of noble gas elements selected from among hydrogen, hydrogen and helium, argon, krypton, and neon. The silicon gas is preferably diluted with a dilution rate of 10 to 1000. It is needless to say that the reactive production of the film by glow discharge decomposition is performed under reduced pressure, but the pressure may be in the range of about 0.1 to 133 Pa. The power supply frequency for generating the glow discharge is in the range of 1 to 120 MHz, and more preferably, in the range of 13 to 60 MHz. An RF power may be set appropriately. The substrate is preferably heated at a temperature of 300° C. or less, and more preferably, 100 to 200° C. Among impurity elements which are mainly added during deposition, atmospheric elements such as oxygen, nitrogen and carbon desirably have a concentration of $1 \times 10^{20}$ cm$^{-3}$ or less. In particular, the concentration of oxygen is $5 \times 10^{19}$ cm$^{-3}$ or less, and more preferably $1 \times 10^{19}$ cm$^{-3}$ or less. The SAS is also called a microcrystalline semiconductor.

The silicon gas may also be mixed with a carbon gas such as CH$_4$ and C$_2$H$_6$, or a germanium gas such as GeH$_4$ and GeF$_4$ to set the energy bandwidth in the range of 1.5 to 2.4 eV, or 0.9 to 1.1 eV.

When an impurity element for controlling valence electrons is not added to an SAS intentionally, the SAS exhibits a small N-type conductivity. This is caused by an impurity included in the SAS, and typically, oxygen is considered to be an element which imparts an N-type conductivity. The concentration of oxygen in an SAS varies depending on an RF power density in deposition. It is preferable in the invention that the first semiconductor layer 16 includes oxygen with a concentration of $5\times10^{19}$ cm$^{-3}$ or less, and more preferably $1\times10^{19}$ cm$^{-3}$ or less. Needless to say, not all oxygen functions as a donor, therefore, the amount of impurity elements is arbitrarily determined in order to control a conductivity.

When an impurity element which imparts a P-type conductivity is added to the first semiconductor layer 16 including a channel forming region at the same time as or after the deposition, a threshold voltage can be controlled. Typically, boron is used for an impurity element which imparts a P-type conductivity. An impurity gas such as B$_2$H$_6$ and BF$_3$ may be mixed into the silicon gas at a rate of 1 to 1000 ppm, so that boron has a concentration of $1\times10^{14}$ to $6\times10^{16}$ cm$^3$.

Figure 8A:
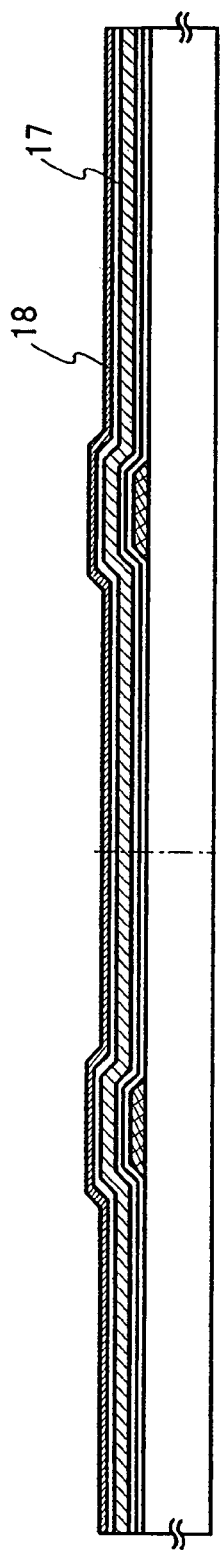
FIGS. 8A to 8C are cross sectional views showing manufacturing steps of the invention.

Subsequently, a second semiconductor layer 17 is formed as shown in FIG. 8A. The second semiconductor layer 17 is formed without intentionally adding an impurity element for controlling valence electrons, and is preferably formed of an SAS as the first semiconductor layer 16. The second semiconductor layer 17 is disposed between the first semiconductor layer 16 and a third semiconductor layer 18 having one conductivity and forming a source and a drain, and thereby it functions as a buffer layer. Therefore, the second semiconductor layer 17 is not necessarily provided when the third semiconductor layer 18 has the same conductivity as the first semiconductor layer 16 having a small N-type conductivity. In the case where an impurity element which imparts a P-type conductivity is added to the third semiconductor layer 18 with the intention of controlling a threshold voltage, the second semiconductor layer 17 functions to gradually change the concentration of impurities, leading to a good joint formation. That is, the second semiconductor layer 17 is capable of serving as a lightly doped impurity region (LDD region) formed between a channel forming region and a source or a drain region in a TFT to be obtained.

The third semiconductor layer 18 having one conductivity may be added with phosphorous as a typical impurity element when forming an N-channel TFT. Specifically, an impurity gas such as PH$_3$ may be mixed into the silicon gas. The third semiconductor layer 18 having one conductivity can be formed of an SAS, an amorphous semiconductor, or a microcrystalline semiconductor as long as valence electrons can be controlled.

A TFT formed in such a manner has a structure in which a channel forming region is not formed between a source, a drain and an LDD region, and electric field concentration can be prevented as well as current concentration.

As set forth above, the forming steps from the first insulating layer 14 to the third semiconductor layer 18 having one conductivity can be sequentially performed without exposing them to the atmosphere. Accordingly, each layer can be formed while not contaminating each surface thereof with atmospheric elements or impurity elements existing in the atmosphere, leading to reduced variations in characteristics of TFTs.

Figure 8B:

Next, a mask 19 is formed by using a photo resist. Then, the first semiconductor layer 16, the second semiconductor layer 17, and the third semiconductor layer 18 having one conductivity are etched to be patterned like islands (FIG. 8B).

Figure 8C:
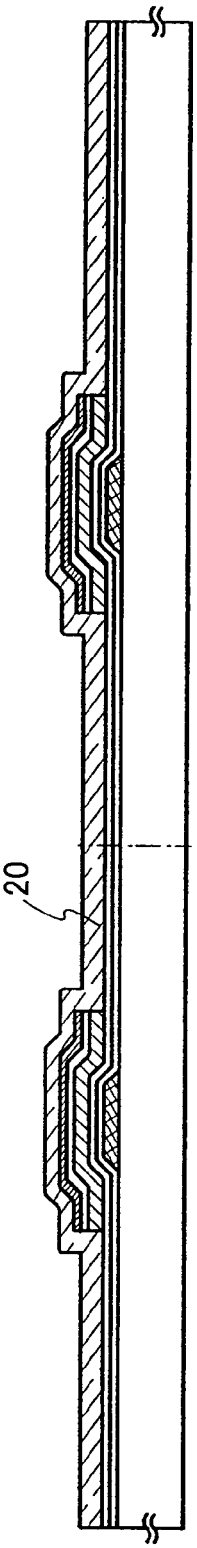

A second conductive layer 20 is formed thereafter to form a wiring connected to the source and the drain. The second conductive layer 20 is formed of aluminum or an aluminum-based conductive material. Alternatively, the second conductive layer 20 may have a laminated structure in which a layer having contact with the semiconductor layer is formed of titanium, tantalum, molybdenum, or nitrides of these elements. Aluminum may be added with 0.5 to 5 atom % of an element such as titanium, silicon, scandium, neodymium, and copper in order to improve the heat resistance (FIG. 8C).

Subsequently, a mask 21 is formed. The mask 21 is patterned to form wirings connected to the source and the drain, and is also used as an etching mask for forming a channel forming region by removing the third semiconductor layer 18 having one conductivity. The conductive layer formed of aluminum or an aluminum-based material may be etched by the use of chloride gas such as BCl$_3$ and Cl$_2$. This etching process provides wirings 23 to 26. The channel forming region is formed by etching by the use of fluoride gas such as SF$_6$, NF$_3$, and CF$_4$. In this case, it is not possible to have etch selectivity relative to first semiconductor layers 16a and 16b which are to be used as base layers, therefore, processing time has to be adjusted appropriately. In this manner, a channel etched TFT can be obtained (FIG. 9A).

Next, a third insulating layer 27 for protecting the channel forming region is formed of a silicon nitride film. The silicon nitride film can be formed by sputtering or glow discharge decomposition, and is required to have a high density in order to block out pollutants in the atmosphere such as organic materials, metals, and moisture. When the silicon nitride film is formed by RF sputtering using silicon as a target, the use of a sputtering gas in which a noble gas element such as argon is mixed with nitride promotes the higher density of the silicon nitride film. On the other hand, when the silicon nitride film is formed by glow discharge decomposition, the silicon nitride film is obtained by diluting a silicon gas by 100 to 500 times with a noble gas element such as argon. Thus, the silicon nitride film is capable of having a high density at a low temperature of 100° C. or less. Further, a fourth insulating layer 28 formed of a silicon oxide film may be laminated on the third insulating layer 27 as needed. The third insulating layer 27 and the fourth insulating layer 28 correspond to passivation layers (FIG. 9B).

A planarizing layer 29 is formed on the third insulating layer 27 and/or the fourth insulating layer 28. The planarizing layer 29 is preferably formed of an organic resin such as acrylic, polyimide, and polyamide, or a siloxane-based insulating film having a Si—O bond and a Si—CHx bond. Then, contact holes are formed in the third insulating layer 27, the fourth insulating layer 28, and the planarizing layer 29, so as to form on the planarizing layer 29 wirings 30 to 33 connected to the wirings 23 to 26 respectively (FIG. 9C).

The wirings 30 to 33 can be formed of an element selected from among Ta, W, Ti, Mo, Al, and Cu, or an alloy or a compound including the element as a main component. Alternatively, a plurality of conductive layers having these elements can be laminated to obtain the wirings 30 to 33. For example, it is possible that the first layer is formed of Ta and the second layer is formed of W, the first layer is formed of TaN and the second layer is formed of Al, the first layer is formed of TaN and the second layer is formed of Cu, or the first layer is formed of Ti, the second layer is formed of Al, and the third layer is formed of Ti. Either the first layer or the second layer may be formed of an AgPdCu alloy. W, an alloy of Al and Si (Al—Si), and TiN may be sequentially laminated as well. Tungsten nitride may be used instead of W, an alloy of Al and Ti (Al—Ti) may by substituted for the alloy of Al and Si (Al—Si), or Ti may be used instead of TiN.

Subsequently, as shown in FIG. 10A, a pixel electrode 35 is formed on the planarizing layer 29 so as to be connected to the wiring 33. In FIGS. 10A and 10B, the pixel electrode 35 is formed of a transparent conductive film to obtain a light transmissive liquid crystal display device, though the liquid crystal display device of the invention is not limited to such a structure. When forming the pixel electrode by the use of a conductive film having light reflectivity, a light reflective liquid crystal display device can be achieved. In that case, a part of the wiring 33 can be used as the pixel electrode.

The channel etched TFT formed in this manner, whose channel portion is formed of an SAS, has a field effect mobility of 2 to 10 cm$^2$/Vs. Accordingly, this TFT can be applied to a switching element of a pixel and an element for forming a scan line (gate line) driver circuit.

An element substrate in which both a switching element of a pixel and a scan line driver circuit are made up of the same type of TFTs can be formed by using five masks: a gate electrode forming mask, a semiconductor region forming mask, a wiring forming mask, a contact hole forming mask, and a pixel electrode forming mask.

Next, a spacer 36 is formed on the wiring 32 or the wiring 33 by using an insulating film. In FIG. LOA, the spacer 36 is formed on the wiring 32 by using a silicon oxide film for example. Either the pixel electrode 35 or the spacer 36 may be formed first.

An alignment layer 37 is formed so as to cover the wirings 30 to 33, the spacer 36, and the pixel electrode 35, and then it is rubbed.

Then, a sealing member 40 for sealing a liquid crystal is formed as shown in FIG. 10B. Meanwhile, prepared is a second substrate 42 having a counter electrode 43 formed of a transparent conductive film and an alignment layer 44 which has been rubbed. A liquid crystal 41 is dropped into a region surrounded by the sealing member 40, and the second substrate 42 prepared separately is attached with the sealing member 40 so that the counter electrode 43 faces the pixel electrode 35. It is to be noted that a filler may be mixed into the sealing member 40.

A color filter, a light shielding film (black matrix) for preventing the disclination, or the like may be additionally provided. Further, a polarizer 51 is attached to the opposite surface of the first substrate 10 on which the TFTs are formed, while a polarizer 52 is attached to the opposite surface of the second substrate 42 on which the counter electrode 43 is formed.

For the transparent conductive film used for the pixel electrode 35 or the counter electrode 43, indium oxide mixed with zinc oxide (ZnO) of 2 to 20% may be used as well as ITO, IZO, or ITSO. A liquid crystal element 55 is formed by overlapping the pixel electrode 35 with the liquid crystal 41 and the counter electrode 35.

A liquid crystal is injected by a dispenser method in the above description, though the invention is not limited to this. A liquid crystal may be injected by a dipping method using capillary phenomenon after attaching the second substrate.

Embodiment 3

FIG. 11A is a plan view of a liquid crystal display device using the invention. The liquid crystal display device shown in FIG. 11A comprises a semi-amorphous TFT substrate 1101, a counter substrate 1102, a pixel portion 1103, a gate signal line driver circuit 1104, a source signal line driver circuit 1105, and an FPC 1106. FIG. 11B is a cross sectional view taken by cutting along a dotted line of the liquid crystal display device in FIG. 11A. A liquid crystal material is disposed between the semi-amorphous TFT substrate 1101 and the counter substrate 1102, and sealed with a sealing member 1107.

As set forth above, according to the invention, the gate signal line driver circuit 1104 is integrally formed on the substrate by using semi-amorphous TFTs, leading to reduction in the cost of implementation and improvement of the reliability in connecting parts. In FIG. 11A, the source signal line driver circuit 1105 is mounted on the semi-amorphous TFT substrate 1101. In this embodiment, the source signal line driver circuit 1105 is formed on another glass substrate, and thereby a driver circuit chip having the same length as the lateral direction of the pixel portion is formed to be mounted on the semi-amorphous TFT substrate 1101. The driver circuit chip formed on a glass substrate contributes to reduction in costs as compared with a single crystalline chip. The source signal line driver circuit 1105 is not necessarily mounted by using a chip formed on a glass substrate, and a single crystalline chip may be mounted on the semi-amorphous TFT substrate 1101 or on the FPC 1106.

Embodiment 4

Figure 12:
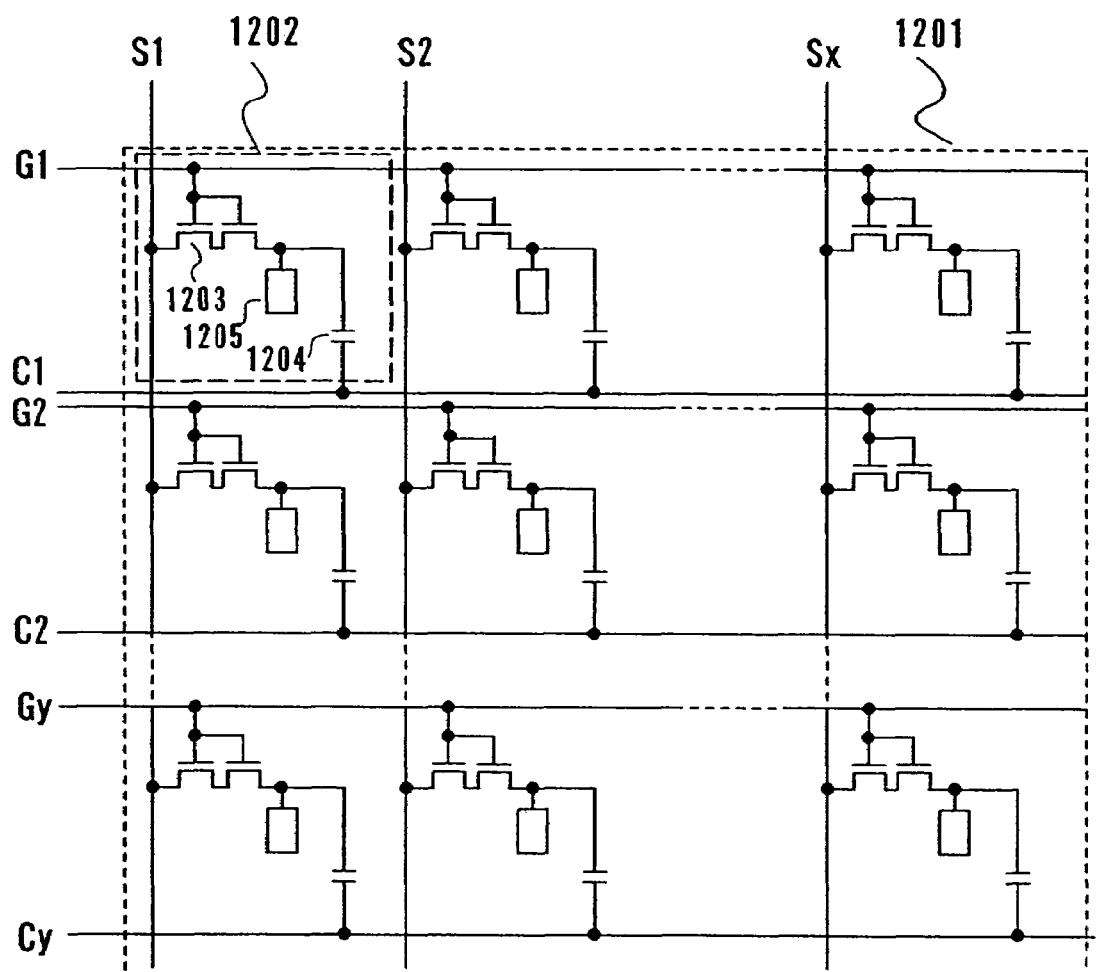
FIG. 12 is a diagram showing a pixel of a liquid crystal display device according to the invention.

FIG. 12 is an equivalent circuit diagram of a pixel portion of a liquid crystal display device using the invention. A pixel portion 1201 comprises source signal lines S1, S2, . . . , and Sx, gate signal lines G1, G2, . . . , and Gy, capacitor lines C1, C2, . . . , and Cy, and a plurality of pixels. A pixel 1202 comprises a pixel TFT 1203, a pixel electrode 1205, and a storage capacitor 1204. In the case of using a semi-amorphous TFT for the pixel TFT 1203, the pixel TFT 1203 has a double gate structure in order to reduce the OFF-current as shown in FIG. 12, since a semi-amorphous TFT has a larger OFF-current as compared with an amorphous TFT. Although a double gate structure is shown in FIG. 12, the pixel TFT 1203 may have a triple gate or multi gate structure.

Embodiment 5

Figure 13:
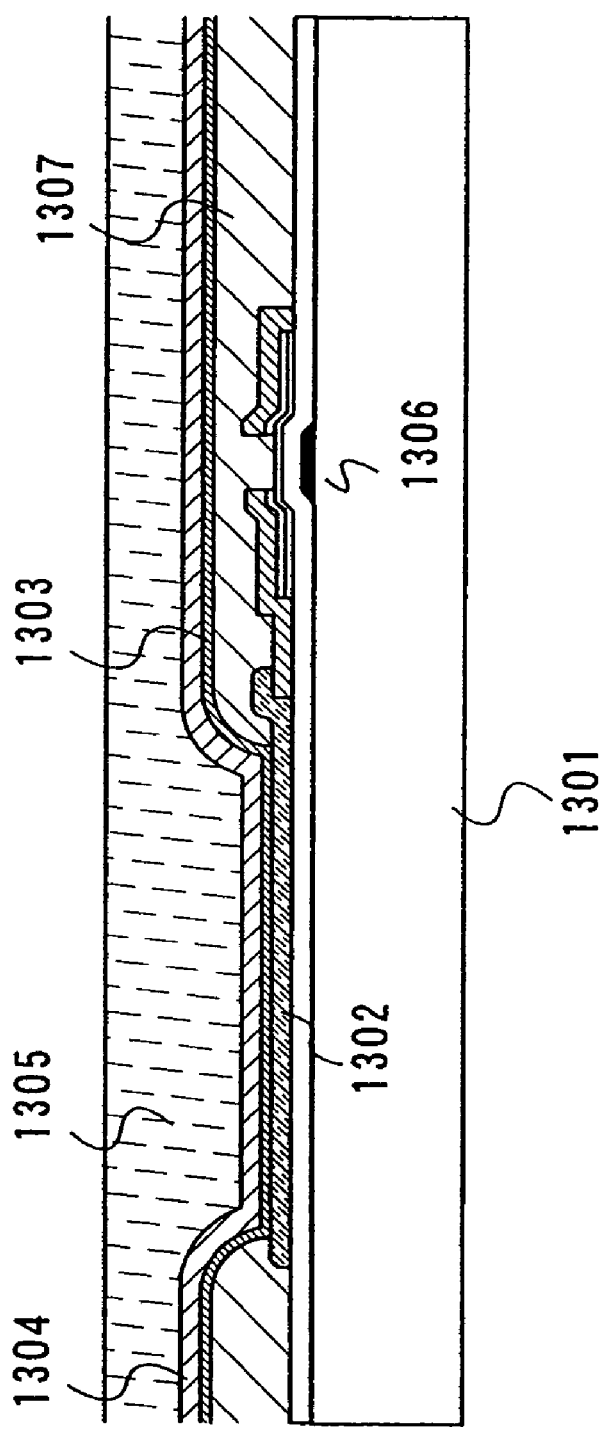
FIG. 13 is a diagram showing a self-light emitting display device according to the invention.

FIG. 13 is cross sectional view of a pixel portion of a self-light emitting display device using the invention. An EL element is used as a light emitting element in FIG. 13. A pixel TFT 1306 using a semi-amorphous TFT is formed on a TFT substrate 1301, and an electrode 1302 is formed thereover so as to be connected to a drain electrode of the pixel TFT 1306. Then, an insulating layer 1307 is deposited and patterned to form an opening in the electrode 1302. Subsequently, an organic material 1303 serving as a light emitting portion is deposited and an electrode 1304 is formed thereon. Known materials may be used for the organic material and the electrodes. Depending on the combination of materials, top emission, bottom emission, or dual emission can be achieved. An area 1305 over the electrode 1304 is shielded from the outside and sealed. The sealing keeps out the external moisture and the like, and thus degradation of an EL material can be prevented.

Embodiment 6

Figure 14:
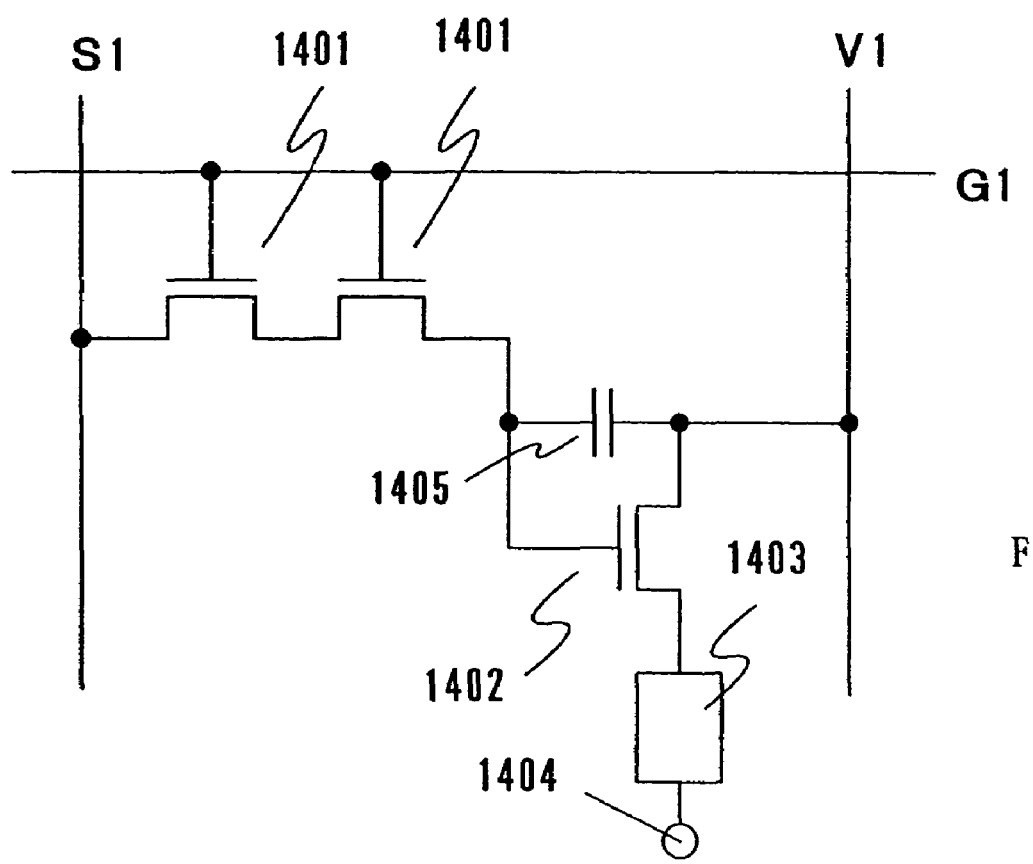
FIG. 14 is a diagram showing a pixel of a self-light emitting display device according to the invention.

FIG. 14 shows a pixel configuration of a self-light emitting display device using the invention. A pixel shown in FIG. 14 comprises a source signal line S1, a gate signal line G1, a power supply line VI, switching TFTs 1401, a driving TFT 1402, a light emitting element 1403, an electrode 1404, and a storage capacitor 1405. Since an N-channel TFT is generally used for a pixel TFT using a semi-amorphous TFT, the switching TFTs 1401 and the driving TFT 1402 have an N-type conductivity in FIG. 14, however, the invention is not limited to the N-channel TFT.

A semi-amorphous TFT has a larger OFF-current as compared with an amorphous TFT. Therefore, in the case where a semi-amorphous TFT is used for a pixel TFT, the pixel TFT has a double gate structure as shown in FIG. 14 to reduce the OFF-current. Although the double gate structure is shown as an example in FIG. 14, a triple gate TFT or a multi gate TFT having triple or more gates may also be adopted.

The pixel configuration with two TFTs is shown in FIG. 14, though the invention is not limited to this, and other known pixel configurations may be adopted as well.

Embodiment 7

The display device formed in such a manner can be applied to a display portion of various electronic apparatuses. Explanation is hereinafter made on an electronic apparatus which includes the display device of the invention as a display medium.

The display device of the invention can be applied to a television, a video camera, a digital camera, a head mounted display (goggle type display), a game player, a car navigation system, a personal computer, and the like. Specific examples of them are shown in FIGS. 15A to 15C.

Figure 15A:
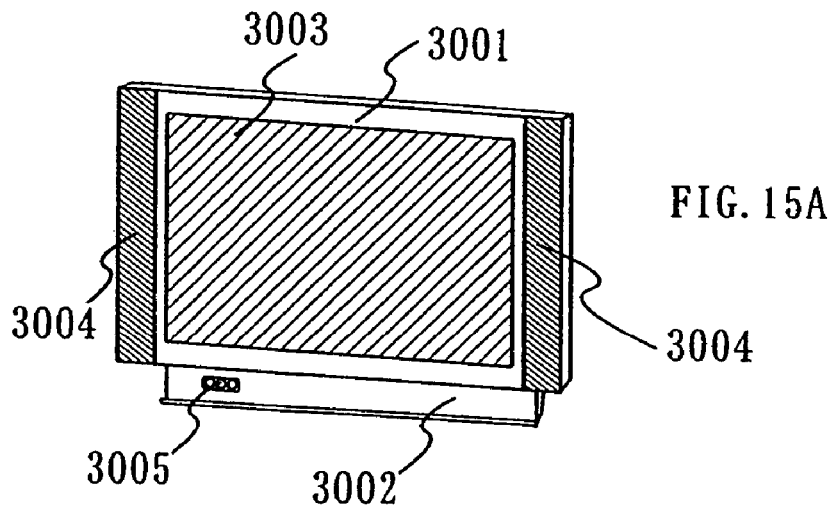
FIGS. 15A to 15C are views showing electronic apparatuses using the display device of the invention.

FIG. 15A shows a television which includes a housing 3001, a supporting base 3002, a display portion 3003, a speaker portion 3004, a video input terminal 3005 and the like. The display device of the invention can be applied to the display portion 3003 to complete a television.

Figure 15B:
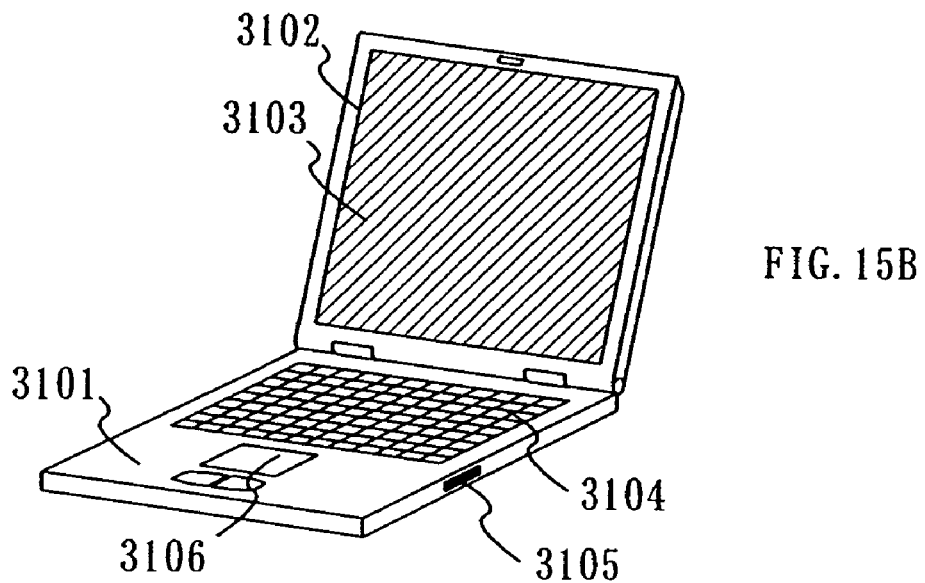

FIG. 15B shows a notebook personal computer which includes a main body 3101, a housing 3102, a display portion 3103, a keyboard 3104, an external connecting port 3105, a pointing mouse 3106 and the like. The display device of the invention can be applied to the display portion 3103 to achieve a small and lightweight notebook personal computer.

Figure 15C:
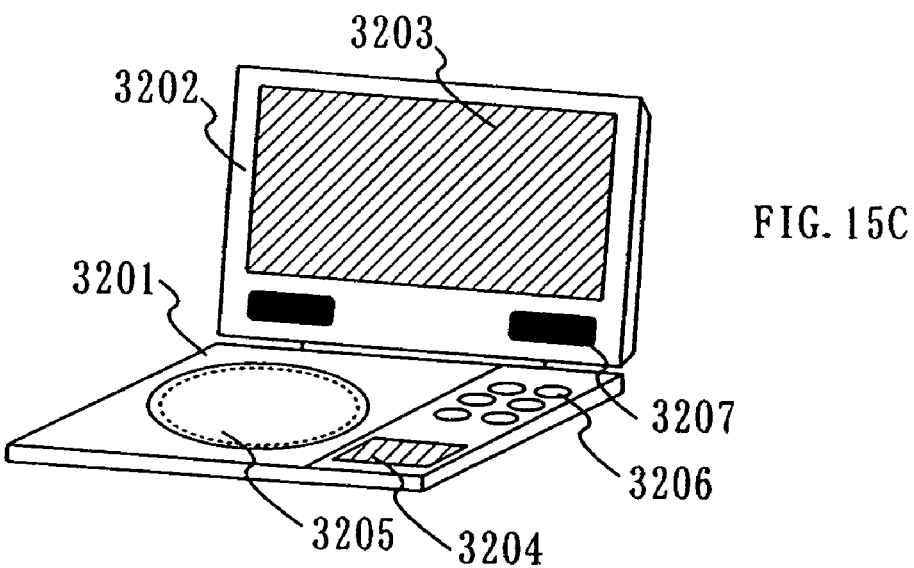

FIG. 15C shows an image reproducing device provided with a recording medium (specifically, a DVD reproducing device), which includes a main body 3201, a housing 3202, a recording medium (CD, LD, DVD, or the like) reading portion 3205, an operating switch 3206, a display portion A 3203, a display portion B 3204 and the like. The display portion A 3203 mainly displays image information whereas the display portion B 3204 mainly displays character information. The display device of the invention can be applied mainly to the display portion A 3203 to achieve a small and lightweight image reproducing device. It is to be noted that the display device of the invention can be applied to other image reproducing devices provided with a recording medium, such as a CD reproducing device and a game player.

As set forth above, the application range of the invention is so wide that the invention can be applied to electronic apparatuses of all fields. The electronic apparatuses shown in this embodiment can be obtained by using any configuration shown in Embodiment Mode 1 and Embodiments 1 to 6.

This application is based on Japanese Patent Application serial no. 2003-277119 filed in Japan Patent Office on 18, Jul., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A display device comprising:
a plurality of scan lines provided in a first conductive material over a substrate;
a plurality of pixels over the substrate; and
a scan line driver circuit over the substrate,
wherein the scan line driver circuit comprises a shift register and a level shifter,
the shift register is connected to a first power supply terminal;
the level shifter is connected to a second power supply terminal,
each of the pixels and the scan line driver circuit comprises:
a gate electrode comprising the first conductive material over the substrate;
a gate insulating film over the gate electrode;
a lamination film over the substrate; and
a second conductive layer over the lamination film,
the lamination film comprising:
a first semiconductor layer comprising semi-amorphous semiconductor formed over the gate electrode with the gate insulating film interposed therebetween;
a second lightly-doped semiconductor layer formed on the first semiconductor layer;
a third semiconductor layer having n-type conductivity formed over the first semiconductor layer with the second lightly-doped semiconductor layer interposed at least between the first semiconductor layer and the third semiconductor layer,
wherein a voltage of the first power supply terminal is lower than a voltage of the second power supply terminal.

2. A device according to claim 1, wherein the display device is a liquid crystal display device.

3. A device according to claim 1, wherein the display device is a self-light emitting display device.

4. A device according to claim 3, wherein the display device is a display device using an EL material.

5. An electronic apparatus comprising the display device according to claim 1.

6. A display device comprising:
a plurality of scan lines comprising a first conductive material over a substrate;
a plurality of pixels over the substrate; and
a scan line driver circuit over the substrate,
wherein the scan line driver circuit comprises a shift register, a level shifter, a first power supply terminal, and a second power supply terminal;
the shift register is connected to the first power supply terminal;
the level shifter is connected to the second power supply terminal,
each of the pixels and the scan line driver circuit comprises:
a gate electrode comprising the first conductive material over the substrate;
a gate insulating film over the gate electrode;
a lamination film over the substrate; and
a conductive layer comprising a second conductive material over the lamination film,
the lamination film comprising:
a first semiconductor layer comprising semi-amorphous semiconductor formed over the gate electrode with the gate insulating film interposed therebetween;
a second semiconductor layer comprising semi-amorphous semiconductor formed on the first semiconductor layer;
a third semiconductor layer having n-type conductivity formed over the first semiconductor layer with the second semiconductor layer interposed at least between the first semiconductor layer and the third semiconductor layer, wherein a voltage of the first power supply terminal is lower than a voltage of the second power supply terminal.

7. A device according to claim 6, wherein the display device is a liquid crystal display device.

8. A device according to claim 6, wherein the display device is a self-light emitting display device.

9. A device according to claim 8, wherein the display device is a display device using an EL material.

10. An electronic apparatus comprising the display device according to claim 6.

11. A device according to claim 1 wherein the first semiconductor layer comprises a channel region.

12. A device according to claim 1 wherein the third semiconductor layer comprises a source or a drain.

13. A device according to claim 6 wherein the first semiconductor layer comprises a channel region.

14. A device according to claim 6 wherein the third semiconductor layer comprises a source or a drain.

15. A display device comprising:
a plurality of scan lines comprising a first conductive material over a substrate;
a plurality of pixels over the substrate;
a scan line driver circuit over the substrate;
a first power supply line and a second power supply line,
wherein the scan line driver circuit comprises a first buffer circuit, a level shifter, and a second buffer circuit,
wherein an output of the first buffer circuit is input into the level shifter,
wherein an output of the level shifter is input into the second buffer circuit,
wherein each of the first buffer circuit, the level shifter, and the second buffer circuit comprises a bootstrap circuit,
wherein the first buffer circuit is electrically connected to the first power supply line,
wherein the level shifter and the second buffer circuit are electrically connected to the second power supply line,
wherein a voltage of the first power supply line is lower than a voltage of the second power supply line, and
wherein each of the pixels and the scan line driver circuit comprises:
a gate electrode over the substrate;
a gate insulating film over the gate electrode;
a semiconductor layer comprising semi-amorphous semiconductor over the gate electrode with the gate insulating film interposed therebetween; and
a second conductive layer over the semiconductor layer.

16. A device according to claim 15, wherein the display device is a liquid crystal display device.

17. A device according to claim 15, wherein the display device is a self-light emitting display device.

18. A device according to claim 17, wherein the display device is a display device using an EL material.

19. An electronic apparatus comprising the display device according to claim 15.

20. A device according to claim 15 wherein the semiconductor layer comprises a channel region.

* * * * *